United States Patent
Dinkel

(10) Patent No.: US 9,935,027 B2
(45) Date of Patent: Apr. 3, 2018

(54) ELECTRONIC DEVICE INCLUDING A METAL SUBSTRATE AND A SEMICONDUCTOR MODULE EMBEDDED IN A LAMINATE

(71) Applicant: Infineon Technologies AG, Neubiberg (DE)

(72) Inventor: Markus Dinkel, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/097,453

(22) Filed: Apr. 13, 2016

(65) Prior Publication Data
US 2016/0329260 A1 Nov. 10, 2016

(30) Foreign Application Priority Data
May 7, 2015 (DE) .................. 10 2015 107 109

(51) Int. Cl.
*H01L 23/29* (2006.01)
*H01L 23/14* (2006.01)
(Continued)

(52) U.S. Cl.
CPC ........ *H01L 23/142* (2013.01); *H01L 23/5389* (2013.01); *H01L 24/19* (2013.01); *H01L 24/20* (2013.01); *H01L 23/295* (2013.01); *H01L 24/05* (2013.01); *H01L 24/06* (2013.01); *H01L 24/16* (2013.01); *H01L 24/32* (2013.01); *H01L 24/73* (2013.01); *H01L 24/83* (2013.01); *H01L 24/92* (2013.01); *H01L 2224/0401* (2013.01); *H01L 2224/04105* (2013.01); *H01L 2224/05624* (2013.01); *H01L 2224/05644* (2013.01); *H01L 2224/05647* (2013.01); *H01L 2224/06181* (2013.01); *H01L 2224/12105* (2013.01); *H01L 2224/131* (2013.01); *H01L 2224/16227* (2013.01); *H01L 2224/32245* (2013.01); *H01L 2224/73267* (2013.01); *H01L 2224/83192* (2013.01); *H01L 2224/92244* (2013.01);
(Continued)

(58) Field of Classification Search
CPC . H01L 23/142; H01L 23/5389; H01L 23/295; H01L 24/19; H01L 24/20; H01L 24/05; H01L 24/06; H01L 24/16; H01L 24/32; H01L 24/73; H01L 24/83; H01L 24/92; H01L 2224/05644; H01L 2224/06181; H01L 2224/0401
See application file for complete search history.

(56) References Cited

U.S. PATENT DOCUMENTS

2005/0230820 A1 10/2005 Licht
2006/0023439 A1* 2/2006 Fraley .................. H01L 23/145
361/780
(Continued)

FOREIGN PATENT DOCUMENTS

DE 10 2011 088 218 A1 6/2013

*Primary Examiner* — (Vikki) Hoa B Trinh
(74) *Attorney, Agent, or Firm* — Dicke, Billig & Czaja, PLLC

(57) ABSTRACT

An electronic device having a substrate including a metal layer, an electrically insulating layer disposed above the substrate, a semiconductor module disposed above the electrically insulating layer and a lamination layer disposed above the electrically insulating layer. The lamination layer at least partially embeds the semiconductor module.

19 Claims, 4 Drawing Sheets

(51) Int. Cl.
*H01L 23/538* (2006.01)
*H01L 23/00* (2006.01)

(52) U.S. Cl.
CPC .. *H01L 2224/97* (2013.01); *H01L 2924/1033* (2013.01); *H01L 2924/10253* (2013.01); *H01L 2924/10271* (2013.01); *H01L 2924/10272* (2013.01); *H01L 2924/10329* (2013.01); *H01L 2924/1305* (2013.01); *H01L 2924/13055* (2013.01); *H01L 2924/13062* (2013.01); *H01L 2924/13091* (2013.01); *H01L 2924/14* (2013.01); *H01L 2924/141* (2013.01); *H01L 2924/1431* (2013.01); *H01L 2924/1434* (2013.01); *H01L 2924/1461* (2013.01); *H01L 2924/16251* (2013.01); *H01L 2924/19041* (2013.01); *H01L 2924/19042* (2013.01)

(56) References Cited

U.S. PATENT DOCUMENTS

| | | |
|---|---|---|
| 2009/0236749 A1 | 9/2009 | Otremba et al. |
| 2014/0117565 A1 | 5/2014 | Ewe et al. |
| 2015/0054159 A1 | 2/2015 | Hoegerl et al. |

* cited by examiner

ELECTRONIC DEVICE INCLUDING A METAL SUBSTRATE AND A SEMICONDUCTOR MODULE EMBEDDED IN A LAMINATE

CROSS-REFERENCE TO RELATED APPLICATION

This Utility Patent Application claims priority to German Patent Application No. 10 2015 107 109.6 filed May 7, 2015; and which is incorporated herein by reference.

BACKGROUND

Electronic device including a metal substrate and a semiconductor module embedded in a laminate This invention relates, in general, to electronic devices and methods for fabricating electronic devices. In particular, the electronic devices may include a metal substrate and a semiconductor module embedded in a laminate.

Electronic devices may include a substrate like a metal core substrate, a metal base layer substrate, or an Insulated Metal Substrate (IMS). Electronic devices may be used in a number of applications, for example as AC-DC converters or DC-DC converters, for electric power steering applications, for high current applications, etc. A substrate may provide a limited surface area for mounting active electrical components like transistors or passive electrical components like capacitors or shunts above the substrate. In other words, the size of the surface area may limit the number of electrical components that can be mounted on the substrate.

Electronic devices and methods of fabrication thereof constantly have to be improved. It may thus be desirable to improve the operation, the design and the fabrication methods of the electronic devices. More particular, it may be desirable to provide an electronic device and a fabrication method that may offer additional free space on the surface area of the substrate without increasing the size of the substrate. In addition, it may be desirable to reduce the size of the substrate without the need of reducing the number of active or passive electrical devices included in the electronic device including the substrate. Furthermore, it may be desirable to improve the thermal management of the electronic devices. For example, it may be desirable to improve the efficiency with which heat generated by a semiconductor element included in the electronic device is dissipated.

BRIEF DESCRIPTION OF THE DRAWINGS

In the following detailed description, reference is made to the accompanying drawings, in which are shown by way of illustration specific examples in which the disclosure may be practiced. In this regard, directional terminology, such as "top", "bottom", "front", "back", "leading", "trailing", etc., may be used with reference to the orientation of the figures being described. Because components of examples can be positioned in a number of different orientations, the directional terminology may be used for purposes of illustration and is in no way limiting.

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The illustrated components are not to scale or not necessarily to scale. Similar reference numbers in the individual figures designate similar parts.

DETAILED DESCRIPTION

Figure 1:
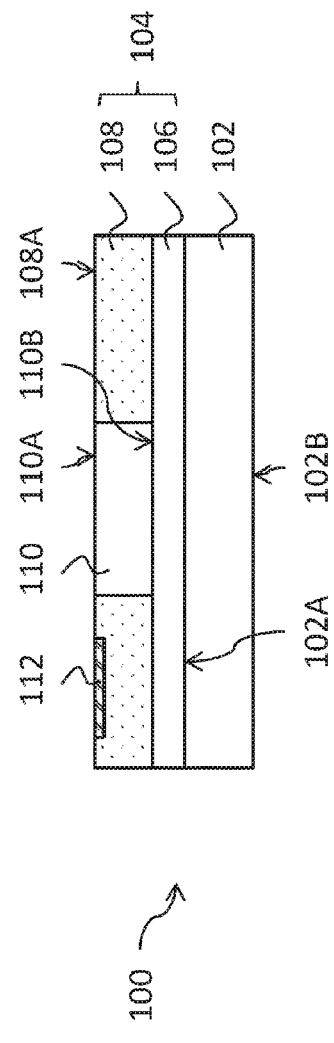
FIG. 1 shows a side-view of an example of an electronic device according to the disclosure including a substrate and a semiconductor module.

It is understood that other examples may be utilized and structural or logical changes may be made without departing from the concept of the present disclosure. The following detailed description, therefore, is not to be taken in a limiting sense.

The features of the various examples described herein may be combined with each other, unless specifically noted otherwise.

As employed in this specification, the terms "connected", "coupled", "electrically connected" and/or "electrically coupled" are not meant to mean that the elements must be directly coupled together. Intervening elements may be provided between the "connected", "coupled", "electrically connected" or "electrically coupled" elements.

Further, the word "over" (or "on") used with regard to e.g., a material layer formed or located "over" a surface of an object may be used herein to mean that the material layer may be located (e.g., formed, deposited, etc.) "directly on", e.g., in direct contact with, the implied surface. The word "over" used with regard to e.g., a material layer formed or located "over" a surface may also be used herein to mean that the material layer may be located (e.g., formed, deposited, etc.) "indirectly on" the implied surface with e.g., one or more additional layers being arranged between the implied surface and the material layer.

Dies as described in the following may be small blocks of semiconductor material, on which a given functional circuit may be fabricated. Integrated circuits may be produced in large batches on a single wafer of electronic-grade silicon or other semiconductor material through processes such as photolithography. The wafer may be cut into many pieces, wherein each of these pieces may be referred to as a "die". Afterwards, one or more of the separated dies may be packaged. Packaging may involve attaching the die to a substrate, providing electrical connections to the die and providing a package at least partly encapsulating the die. It is also possible that dies are not encapsulated and that instead bare dies or dies attached to a carrier like for example a leadframe are included in the electronic devices described in the following.

Devices or electronic devices containing multiple semiconductor chips, i.e. dies including a given functional circuit, are described in the following. It is noted that the terms "die", "semiconductor die", "chip" and "semiconductor chip" may be used synonymously in this specification. The term "semiconductor module" may be used for a component including a semiconductor chip. In particular, a die or semiconductor chip may include a power semiconductor. A power semiconductor chip is a specific type of semiconductor chip that may be designed to handle significant power levels. Power semiconductor chips may be particularly configured to switch and control currents and/or voltages. They may be implemented as power MOSFETs, IGBTs, JFETs, power bipolar transistors and diodes. Power semiconductor chips can be found in most power supplies, DC-DC converters and motor controllers, for example. Power semiconductor chips may be stacked on top of each other for specific applications, such as e.g., half-bridge circuits.

The semiconductor chips described herein may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (Micro-Electro Mechanical Systems) and may include micro-mechanical structures, such as bridges, membranes or tongue structures. The semiconductor chips need not be manufactured from specific semiconductor material. The semiconductor chips may, for example, comprise Si, SiC, SiGe, GaAs, GaN, and, furthermore, may contain inorganic and/or organic materials that are not semiconductors, such as, for example, insulators, plastics or metals. Moreover, the semiconductor chips may be packaged or unpackaged.

In particular, semiconductor chips having a vertical structure may be involved, that is the semiconductor chips may be fabricated in such a way that electric currents can flow in a direction perpendicular to the main faces of the semiconductor chips. A semiconductor chip having a vertical structure may have electrodes on its two main faces, that is on its top side and bottom side. In particular, power semiconductor chips may have a vertical structure and may have load electrodes on both main faces. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or diodes. By way of example, the source electrode and gate electrode of a power MOSFET may be situated on one face, while the drain electrode of the power MOSFET may be arranged on the other face. In addition, the devices described herein may include integrated circuits configured to control the integrated circuits of the power semiconductor chips.

The semiconductor chips may have contact pads (or contact elements or terminals) which may allow an electrical contact to be made with the integrated circuits included in the semiconductor chips. The contact pads may include one or more metal layers that may be applied to the semiconductor material. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is various compositions and concentrations of the materials contained in the metal layers are possible.

One or more metal layers having the shape of conductor lines (or conductor tracks) may be provided and may be electrically coupled to the semiconductor chip. The metal layers may, for example, be used to produce a redistribution layer or wiring layer. The conductor lines may be employed as wiring layers to make electrical contact with the semiconductor chips from outside the device and/or to make electrical contact with other semiconductor chips and/or components contained in the device. The conductor lines may couple the contact pads of the semiconductor chips to the external contact pads. The conductor lines may be manufactured with any desired geometric shape and any desired material composition. Any desired metal, for example aluminum, nickel, palladium, silver, tin, gold or copper, or metal alloys may be used as the material. The conductor lines need not be homogenous or manufactured from just one material, that is to say various compositions and concentrations of the materials contained in the conductor lines are possible. Furthermore, the conductor lines may be arranged above or below or between electrically insulating layers.

The devices described below may include external contact pads (or external contact elements), which may be of any shape and size. The external contact pads may be accessible from outside the devices and may thus allow electrical contact to be made with the semiconductor chips from outside the devices. The external contact pads may be composed of any desired electrically conductive material, for example of a metal, such as copper, aluminum or gold, a metal alloy or an electrically conductive organic material. The external contact pads may be formed by portions of the metal layers. Solder material, such as solder balls or solder bumps, may be deposited on the external contact pads. The external contact pads may be arranged on an upper surface of the devices. A lower surface of the devices and/or side surfaces of the devices may be free of external contact pads.

The semiconductor chips may be packaged. That is, the semiconductor chips or at least parts of the semiconductor chips may be covered with an encapsulation material, which may be electrically insulating and which may form an encapsulation body. For example, the encapsulation material may include at least one of a prepreg, a resin, an epoxy, a mold compound, a polymer, an imide and a laminate.

The devices described herein may include at least one mounting surface. The mounting surface may serve to mount the device onto another component or vice versa. External contact elements and, in particular, external contact surfaces may be disposed on the mounting surface to allow to electrically couple the device to the component. Solder deposits, such as solder balls, or other appropriate connection elements may be used to establish an electrical and, in particular, mechanical connection between the device and the other component.

FIG. 1 shows an example of an electronic device 100 in accordance with the disclosure. The electronic device 100 includes a substrate 102, an embedding compound 104 and a semiconductor module 110. The substrate 102 may include an upper surface 102A, a lower surface 102B opposite the upper surface 102A and side surfaces connecting the upper surface 102A to the lower surface 102B. The embedding compound 104 may be arranged above the upper surface 102A of the substrate 102. In one example of an electronic device 100, the embedding compound 104 only covers the upper surface 102A, but not the side surfaces or the lower surface 102B of the substrate 102. In particular, the embedding compound 104 may completely cover the upper surface 102A of the substrate 102.

The substrate 102 may for example include an IMS, a metal core, or a metal base layer. The substrate may include at least one of Al, Cu and Fe. The substrate may include a metal alloy, for example CuFeP.

The substrate 102 may have a thickness measured from the upper surface 102A to the lower surface 102B in the range from about 0.5 mm to about 5.0 mm, more particular in the range from about 1 mm to about 2.5 mm, and even more particular in the range from about 1 mm to about 2 mm. The substrate 102 may have a length measured along a first edge of the upper surface 102A in the range from about 1 cm to about 20 cm, more particular in the range from about 2 cm to about 10 cm, and even more particular in the range from about 5 cm to about 10 cm. The substrate 102 may have a width measured along a second edge of the upper surface 102A in the range from about 0.5 cm to about 8 cm, more particular in the range from about 1 cm to about 5 cm. The substrate 102 may have a quadratic shape, a rectangular shape, or any other appropriate shape. The substrate 102 may include through-holes for mounting the electronic device 100 on a frame or any other appropriate device as for example described further below with respect to FIG. 5.

The substrate 102 may be configured to dissipate heat generated by the semiconductor module 110 and/or further devices mounted on the embedding compound 104 as described further below with respect to FIG. 4.

The semiconductor module 110 may be arranged above the substrate 102 and it may be embedded in the embedding compound 104. The semiconductor module 110 may comprise an upper surface 110A, a lower surface 110B and side surfaces connecting the upper surface 110A with the lower surface 110B. The semiconductor module 110 may comprise a semiconductor package including one or more semiconductor chip(s) and an encapsulation material at least partially encapsulating the semiconductor chip(s).

The semiconductor module 110 may for example be configured to operate as a half-bridge, an H-bridge, or a 3-phase bridge circuit. The semiconductor module 110 may include a single semiconductor chip or multiple semiconductor chips.

Note that an electronic device like electronic device 100 may include more than one semiconductor modules like semiconductor module 110. The more than one semiconductor modules may be of the same kind or may be of different kinds.

In the example of FIG. 1, the embedding compound 104 covers the lower surface 110B and the side surfaces, but not the upper surface 110A of the semiconductor module 110. In another example of an electronic device, the embedding compound 104 may partially cover the upper surface 110A of the semiconductor module 110. In yet another example, the embedding compound 104 may completely cover the semiconductor module 110 from all sides.

The embedding compound 104 may include layers. For example, as shown in FIG. 1, the embedding compound 104 may include a first layer 106 arranged above the substrate 102 and a second layer 108 arranged above the first layer 106. Furthermore, the first layer 106 may be arranged between the substrate 102 and the semiconductor module 110. The first layer 106 may be applied directly on the upper surface 102A of the substrate 102 and on the lower surface 110B of the semiconductor module 110. The first layer 106 may be configured to electrically insulate the semiconductor module 110 from the substrate 102. In one example of an electronic device, the second layer 108 may be electrically insulating. The second layer 108 may have a thickness in a range from 30 µm to 300 µm.

The embedding compound 104 may include more than just the first layer 106 and second layer 108 as shown in FIG. 1. The further layer(s) may be arranged above the second layer 108 and/or below the first layer 106 and/or between the first layer 106 and the second layer 108.

The embedding compound may include at least one of a laminate, an epoxy, a filled epoxy, glass fiber filled epoxy, an imide, a thermoplast and a duroplast polymer or polymer blends. In particular, each of the first layer 106 and the second layer 108 may include at least one of these materials. The first layer 106 and the second layer 108 may include identical or different materials or material compositions. The first layer 106 and/or the second layer 108 may include a pre-preg and a Cu foil.

The electronic device 100 may include a wiring layer 112. The wiring layer 112 may be arranged on an upper surface 108A of the embedding compound 104. The wiring layer 112 may be structured and it may include conducting paths and/or coupling pads for coupling devices to the wiring layer 112. Coupling may for example include soldering. In one example of an electronic device not shown in FIG. 1, the wiring layer 112 may be electrically coupled to the semiconductor module 110 and may be configured to electrically couple the semiconductor module 110 to the outside. The wiring layer 112 may include several vertically stacked layers of conductive material, wherein the vertically stacked layers may be linked by vias. In one example of an electronic device, the first layer 106 does not necessarily include any form of wiring layer.

The upper surface of the embedding compound 108A and the upper surface of the semiconductor module 110A may be coplanar in one example. The wiring layer 112 may be coplanar with the upper surface 108A, or it may be arranged above the upper surface 108A.

Heat produced by the semiconductor module 110 may predominantly be dissipated through the first layer 106 to the substrate 102. To this end, the electronic device 100 may be advantageously configured to provide only a small thermal resistance between the semiconductor module 110 and the substrate 102. A thermal resistance between the semiconductor module 110 and the substrate 102 may be smaller than a thermal resistance between a device 402 (compare FIG. 4) mounted on the upper surface 108A and the substrate 102.

According to an embodiment of an electronic device 100 the embedding compound 104 may include a first laminate layer (first layer 106) arranged on the substrate 102, a second laminate layer (second layer 108) arranged on the first laminate layer and a Cu foil arranged on the second laminate layer. The Cu foil may be structured or may be free of any structures. The semiconductor module 110 may be arranged on the first laminate layer and the second laminate layer may be configured to embed the semiconductor module 110.

According to another embodiment of an electronic device 100 the embedding compound 104 may include a first laminate layer (first layer 106) arranged on the substrate 102, a pre-preg layer arranged on the first laminate layer and embedding the semiconductor module 110, a second laminate layer arranged on the pre-preg layer and the semiconductor module 110 and a Cu foil arranged on the second laminate layer. The pre-preg layer may include a cavity configured to receive the semiconductor module 110. The Cu foil may be structured or may be free of any structures.

According to yet another embodiment of an electronic device 100 the embedding compound 104 may include a pre-preg layer arranged on the substrate 102, a laminate layer arranged on the pre-preg layer and a Cu foil arranged on the laminate layer. The pre-preg layer may include a cavity configured to receive the semiconductor module 110. In insulation layer may be arranged on a lower surface of the semiconductor module 110 such that the insulation layer is arranged between the substrate 102 and the semiconductor module 110, but not between the substrate 102 and the pre-preg layer. The insulation layer may include a laminate.

Figure 2A:
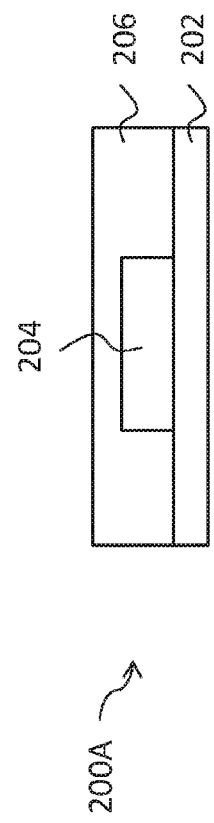
FIGS. 2A and 2B show side-views of two examples of semiconductor modules that may be includes in an electronic device according to the disclosure.

FIG. 2A shows an example of a semiconductor module or semiconductor package 200A, wherein the semiconductor module 200A may correspond to the semiconductor module 110 of FIG. 1. The semiconductor module 200A may include a carrier 202, a semiconductor chip 204 arranged above the carrier and an encapsulation material 206 encapsulating the semiconductor chip 204.

A further example of a semiconductor module similar to semiconductor package 200A includes the carrier 202 and the semiconductor chip 204 (see FIG. 2A), but does not include an encapsulation material encapsulating the semiconductor chip 204.

The carrier 202 may include a metal or a metal alloy. For example, the carrier 202 may include at least one of Al, Cu, and Fe. In one example, the carrier 202 may include a leadframe.

The semiconductor chip 204 may be electrically insulated from the carrier 202 or it may be electrically coupled to it. Note that in FIG. 2A only a single semiconductor chip 204 is shown. However, the semiconductor module 200A may also include more than one semiconductor chip 204, for example two semiconductor chips. The more than one semiconductor chips may be of identical types or different types of semiconductor chips. For example, the more than one semiconductor chips may be two power semiconductor chips. In addition, a logic semiconductor chip may be configured to control the power semiconductor chip(s).

The encapsulation material 206 may include at least one of a laminate, an epoxy, a filled epoxy, glass fiber filled epoxy, an imide, a thermoplast and a duroplast polymer or polymer blends.

The semiconductor module 200A may include a conductive wiring (not shown in FIG. 2A) for electrically connecting the semiconductor chip(s) 204 to the outside of the semiconductor module 200A. The semiconductor module 200A may be configured to electrically couple the semiconductor chip(s) 204 to the wiring layer 112 of the electronic device 100.

Figure 2B:
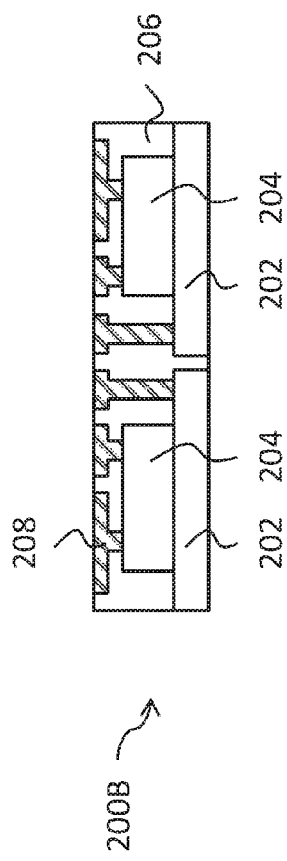

FIG. 2B shows a further example of a semiconductor module or semiconductor package 200B, wherein the semiconductor module 200B may correspond to the semiconductor module 110 of FIG. 1. The semiconductor module 200B may include one or more semiconductor chips 204 (two semiconductor chips are shown in the example of FIG. 2B) and a wiring layer 208 arranged above the semiconductor chip(s) 204. The wiring layer 208 may be exposed on the upper surface 108A of electronic device 100 and may be configured to electrically connect to the semiconductor chip(s) 204 from the outside. The wiring layer 208 may include one or more horizontal layers of conductive traces that may be interconnected by vias. The wiring layer 208 of semiconductor module 200B may be coplanar with the wiring layer 112 arranged on the embedding compound 104 and may include the same material composition or a different material composition. The wiring layer 208 may be exposed to the outside on the upper surface 108A of electronic device 100.

In one example, the semiconductor chip(s) 204 may be electrically coupled to the carrier 202. For example an electrode (e.g., a load electrode) located on the lower surface of the semiconductor chip(s) 204 may be electrically coupled to the carrier 202. Furthermore, the wiring layer 208 may provide an electrical contact to the carrier 202.

The carrier 202 may include one or more individual parts. For example, a contact pad may be provided for each semiconductor chip 204. The individual parts may be insulated from each other or may be electrically connected to each other.

Figure 3:
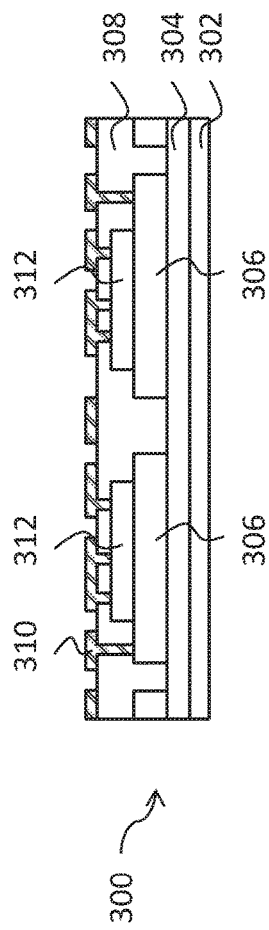
FIG. 3 shows a side-view of a further example of a semiconductor module that may be includes in an electronic device according to the disclosure.

FIG. 3 shows a further example of a semiconductor module or semiconductor package 300, wherein the semiconductor module 300 may correspond to the semiconductor module 110 of FIG. 1. The semiconductor module 300 includes a first metal layer 302, a first insulating layer 304 arranged on the first metal layer 302, a second metal layer 306 arranged on the first insulating layer 304, a second insulating layer 308 arranged on the second metal layer 306 and a wiring layer 310 arranged on the second insulating layer 308.

The first and second metal layers 302 and 306 and the wiring layer 310 may include at least one of Al, Cu, and Fe. The first and second insulating layers 304 and 308 may include at least one of a laminate, an epoxy, a filled epoxy, glass fiber filled epoxy, an imide, a thermoplast and a duroplast polymer or polymer blends.

The second metal layer 306 may include one or more chip pads configured for mounting a semiconductor chip 312 onto each chip pad.

The wiring layer 310 may include vias extending through the second insulating layer 308 and coupled to contact pads on the semiconductor chips 312 and/or to the second metal layer 306.

Figure 4:
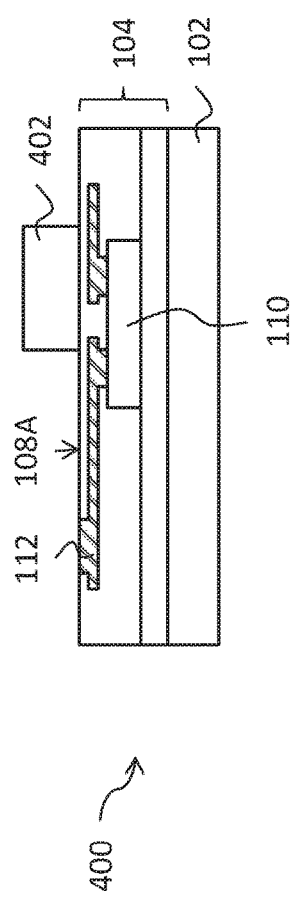
FIG. 4 shows a side-view of a further example of an electronic device according to the disclosure and an active or passive electrical device arranged on the electronic device.

FIG. 4 shows a further example of an electronic device 400 and a device or component 402 arranged on an upper surface 108A of electronic device 400. The device 402 may for example be arranged completely or partially above a footprint of the semiconductor module 110 when viewed in a perpendicular direction. The device 400 may include a passive electrical component like, for example, a capacitor, a pad for a connector, an inductor or a shunt. The device 400 may include an active electrical component like, for example, a semiconductor chip, or a semiconductor module.

Since the semiconductor module 110 is embedded in the embedding compound 104 it does not require space on the upper surface 108A. Embedding the semiconductor module 110 according to the disclosure instead of mounting it on the upper surface 108A may therefore yield free space on the upper surface 108A. Therefore, electronic devices according to the disclosure, such as e.g., electronic devices 100 and 400, may be designed with smaller dimensions compared to a conventional electronic device. Conversely, electronic devices according to the disclosure with the same dimensions as a conventional electronic device may offer additional free space on the upper surface 108A, for example for mounting additional devices 402.

A semiconductor module or semiconductor package 110 for embedding in an electronic device 100 or 400 needs not necessarily be configured as disclosed with respect to the semiconductor modules 200A, 200B and 300. In principle, any "thin" semiconductor package may be used for embedding in electronic devices 100 or 400. Here, a "thin" semiconductor package may be a package that in general includes a laminated layer structure of e.g., at least one insulating layer and at least one wiring layer including vias, instead of a package including e.g., a mold compound and bond wires. Furthermore, a semiconductor module 110 according to the disclosure needs not necessarily include a (metal) carrier. A semiconductor module 110 may even include nothing but a single naked die or a die attached to a carrier.

Figure 5:
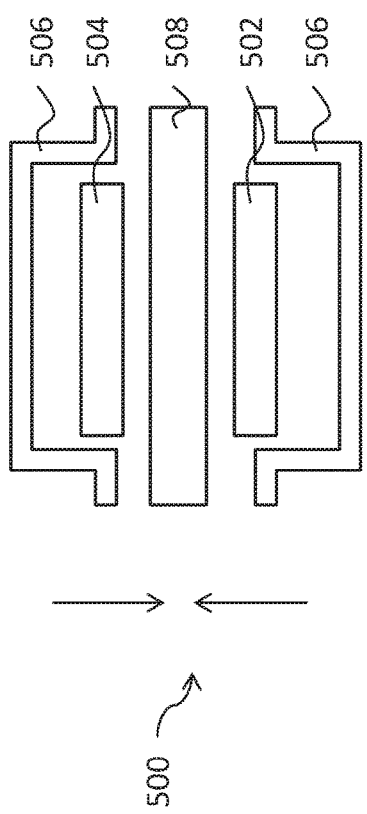
FIG. 5 shows a side-view of an arrangement including an electronic device according to the disclosure.

FIG. 5 shows individual components of an arrangement 500 which are to be combined as indicated by the two illustrated arrows. The arrangement 500 includes a first electronic device 502 and a casing 506 encasing the first electronic device 502. The first electronic device 502 may correspond to the electronic devices 100 or 400. The casing 506 may include a metal casing, for example an Al casing.

The arrangement 500 may optionally include a second electronic device 504, wherein the casing 506 may also encase the second electronic device 504. The second electronic device 504 may include a Printed Circuit Board (PCB) or may correspond to the electronic devices 100 or 400.

The first electronic device 502 may include a load circuit like, for example, a half-bridge circuit, an H-bridge circuit, or a 3-phase bridge circuit, and the second electronic device 504 may include a control logic configured to control the circuit of the first electronic device 502.

The arrangement 500 may optionally include a mounting framework 508 configured for mounting the first electronic device 502 and/or the second electronic device 504 on the mounting framework 508. The mounting framework 508 may include a connector configured for connecting the arrangement 500 to an external device like for example to a motor. The mounting framework 508 may for example include a plastic socketing. The casing 506 may be fixed on the framework 508, for example using screws.

FIGS. 6A-6D show a method for fabricating an electronic device 600, wherein the electronic device 600 may correspond to the electronic devices 100 or 400. Similar parts of the electronic devices 100, 400 and 600 are assigned reference numbers with identical second and third digits.

Figure 6A:
FIGS. 6A-6D show a side-view of an exemplary method for fabricating an electronic device according to the disclosure.

As shown in FIG. 6A a substrate 602 is provided and a first layer 606 is applied on an upper surface of the substrate 602. Applying the first layer 606 may include a lamination process.

Figure 6B:
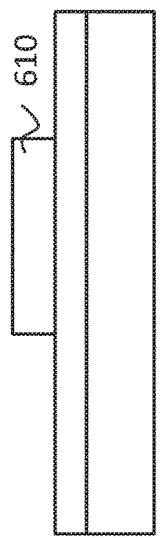

As shown in FIG. 6B a semiconductor module 610 is arranged on the first layer 606. Arranging the semiconductor module 610 on the first layer 606 may include an attaching process. For example, the first layer 606 may have adhesive properties and the semiconductor module may therefore adhere to the first layer 606 when it is placed on the first adhesive layer 606 or when it is pressed down on the first layer 606 with a certain amount of force.

Figure 6C:
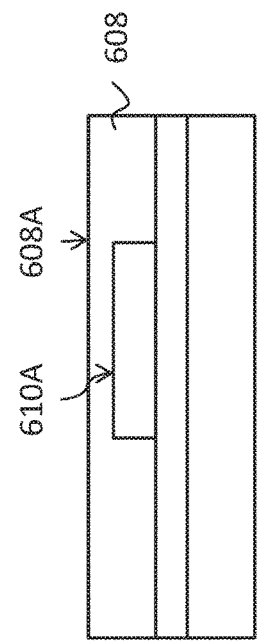

As shown in FIG. 6C a second layer 608 is applied on the first layer 606. Applying the second layer 608 on the first layer 606 may include a lamination process. In one example, the second layer 608 may include a recess configured to receive the semiconductor module 610. The second layer 608 may cover an upper surface 610A of the semiconductor module 610 as shown in FIG. 6C or it may leave the upper surface 610A exposed. In the latter case, an upper surface 608A of the second layer 608 and the upper surface 610A of the semiconductor module 610 may be coplanar.

Alternatively to the process steps shown in FIGS. 6B and 6C, the semiconductor module 610 may already be included in the second layer 608 when the second layer 608 is applied on the first layer 606.

Figure 6D:
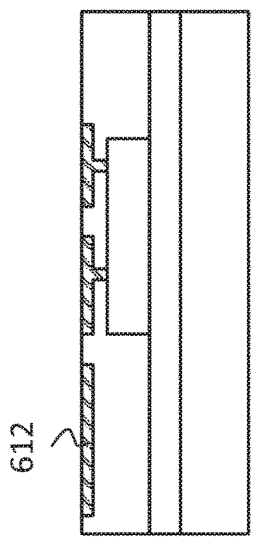

As shown in FIG. 6D a wiring layer 612 may be applied on the upper surface 608A of the second layer 608. Applying the wiring layer 612 may include application of a photomask, an etching process, a laser drilling process, a metal application process and a metal structuring process. The metal application process may include a plating process. The metal structuring process may include the application of a photomask and an etching process.

The wiring layer 612 may be configured to provide bonding pads for mounting active or passive electrical devices onto the upper surface 608A. The wiring layer 612 may include solderable pads configured for soldering active or passive electrical devices onto the solderable pads. Furthermore, the wiring layer 612 may be configured to provide an electrical connection to the semiconductor module 610. Alternatively, the semiconductor module 610 may be exposed on the upper surface 608A and may therefore itself provide electrical contacts to the outside.

Figure 7:
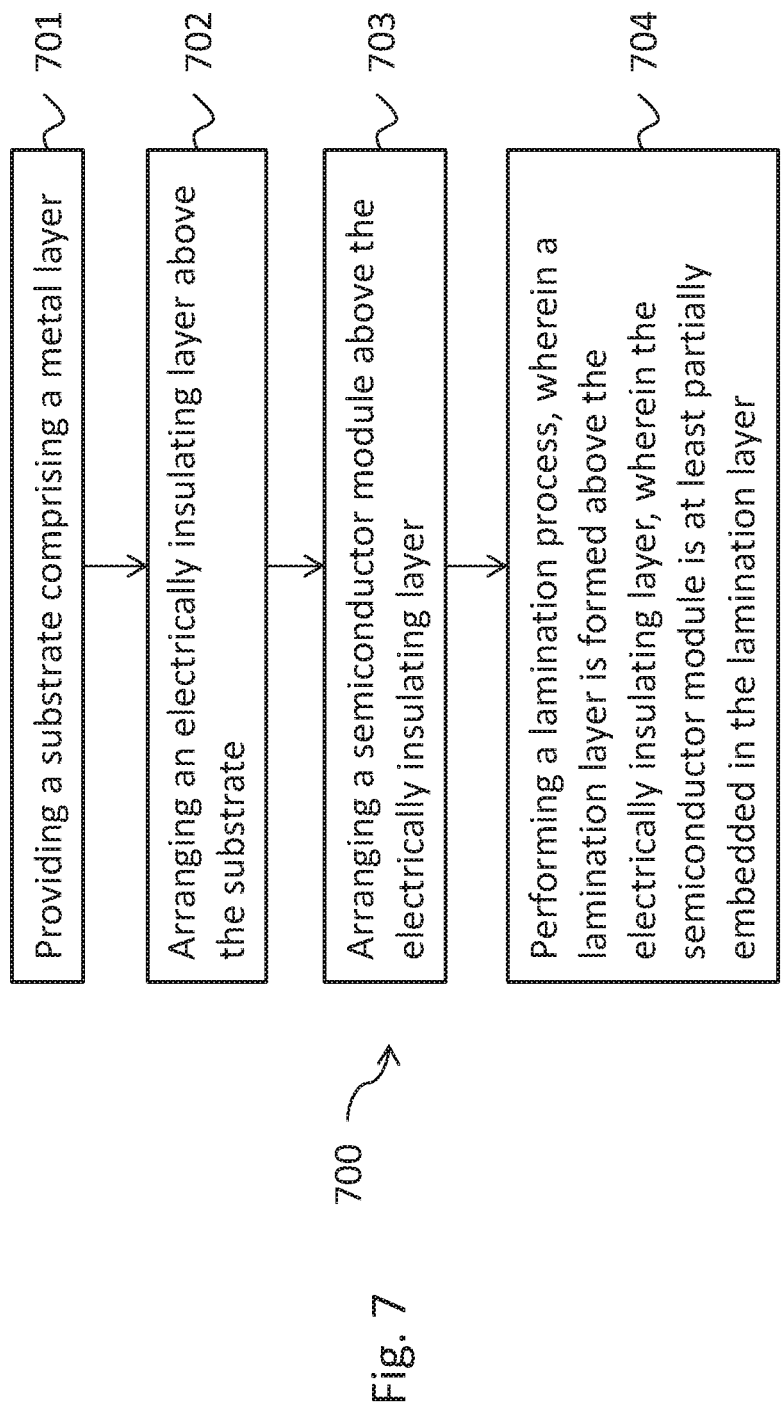
FIG. 7 shows a flow-chart of an example of a method for fabricating an electronic device according to the disclosure.

FIG. 7 shows a flow chart of a method 700 for fabricating an electronic device like the electronic devices 100, 400 and 600. The method 700 includes a first method step 701 of providing a substrate including a metal layer. The method 700 includes a second method step 702 of arranging an electrically insulating layer above the substrate. The method 700 includes a third method step 703 of arranging a semiconductor module above the electrically insulating layer. The method 700 includes a fourth method step 704 of performing a lamination process, wherein a lamination layer is formed above the electrically insulating layer, wherein the semiconductor module is at least partially embedded in the lamination layer.

The method steps 701-704 may be performed consecutively. However, it is also possible that certain method steps are performed simultaneously. For example, method steps 703 and 704 may be performed simultaneously in one example of a method for fabricating an electronic device according to the disclosure.

The method 700 may include additional method steps. For example, after arranging the insulating layer above the substrate (see method step 702), the method 700 may include a method step of curing the insulating layer, for example using a heating process. Curing the insulating layer may be performed before the method step 703.

The method 700 may be performed as a batch process. That is, a multitude of electronic devices may be fabricated simultaneously using the method 700.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ substantially from that illustrated herein.

Although the present invention and its advantages have been described in detail, it should be understood that various changes, substitutions and alterations can be made herein without departing from the spirit and scope of the invention as defined by the appended claims. This application is intended to cover any adaptations or variations of the specific aspects discussed herein. Therefore, it is intended that this disclosure be limited only by the claims and the equivalents thereof.

What is claimed is:

1. An electronic device, comprising:
   a substrate comprising a metal layer;
   an electrically insulating layer disposed on the substrate;
   a semiconductor module disposed on the electrically insulating layer, wherein the semiconductor module includes a carrier, at least one semiconductor chip attached to the carrier, and an encapsulation material disposed over the carrier that at least partially encapsulates the at least one semiconductor chip; and
   a lamination layer disposed on the electrically insulating layer and at least partially embedding side surfaces of the semiconductor module.

2. The electronic device of claim 1, wherein the substrate comprises an insulated metal substrate, a metal core or a metal base layer.

3. The electronic device of claim 1, wherein a thickness of the substrate lies in a range from 0.5 mm to 5.0 mm.

4. The electronic device of claim 1, wherein the metal layer comprises at least one of aluminum and copper.

5. The electronic device of claim 1, wherein at least one of the electrically insulating layer and the lamination layer comprises at least one of a laminate, an epoxy, a filled epoxy, glass fiber filled epoxy, an imide, a thermoplast and a duroplast polymer or polymer blends.

6. The electronic device of claim 1, wherein a thickness of the lamination layer lies in a range from 30 μm to 300 μm.

7. The electronic device of claim 1, wherein the carrier comprises a leadframe.

8. The electronic device of claim 1, wherein the semiconductor module is disposed above the electrically insulating layer, wherein the carrier faces the electrically insulating layer.

9. The electronic device of claim 1, wherein the semiconductor module comprises a power semiconductor chip.

10. The electronic device of claim 1, wherein the semiconductor module further comprises a first electrical wiring layer disposed on a periphery of the semiconductor module that is configured to electrically connect the at least one semiconductor chip to an outside of the semiconductor module.

11. The electronic device of claim 1, wherein a first side of the lamination layer faces the insulating layer and wherein a second side of the lamination layer opposite the first side and a side of the semiconductor module are coplanar.

12. The electronic device of claim 1, wherein a first side of the lamination layer faces the electrically insulating layer and wherein a second side of the lamination layer opposite the first side comprises a second electrical wiring layer.

13. The electronic device of claim 1, further comprising:
   an electrical component disposed above the lamination layer.

14. The electronic device of claim 13, wherein the electrical component comprises at least one of a discrete device, a passive component and a semiconductor chip.

15. The electronic device of claim 1, wherein the semiconductor module is a part of at least one of a half bridge, an H bridge, and a 3-phase bridge.

16. The electronic device of claim 1, wherein the lamination layer comprises a pre-preg and a Cu foil.

17. An electronic device, comprising:
   a metal substrate;
   a semiconductor module arranged over the metal substrate, wherein the semiconductor module comprises a carrier, at least one semiconductor chip attached to the carrier, and an encapsulation material disposed over the carrier that at least partially encapsulates the at least one semiconductor chip, wherein the semiconductor module includes a first main surface that faces the metal substrate, a second main surface that faces away from the metal substrate, and side surfaces that extend from the first main surface to the second main surface;
   a laminate arranged over the metal substrate, wherein the semiconductor module is embedded in the laminate, wherein the side surfaces of the semiconductor module are covered by the laminate, and wherein the laminate is arranged between the metal substrate and the first main surface of the semiconductor module and electrically insulates the metal substrate from the semiconductor module; and
   an electrically conductive wiring layer arranged on an upper surface of the laminate, wherein the wiring layer is exposed from the laminate and provides an electrical coupling to the semiconductor module.

18. A method, comprising:
   providing a substrate comprising a metal layer;
   providing a semiconductor module that includes a carrier, at least one semiconductor chip attached to the carrier, and an encapsulation material disposed over the carrier that at least partially encapsulates the at least one semiconductor chip;
   arranging an electrically insulating layer on the substrate;
   arranging the semiconductor module on the electrically insulating layer; and
   performing a lamination process, wherein a lamination layer is formed on the electrically insulating layer, and wherein side surfaces of the semiconductor module are at least partially embedded in the lamination layer.

19. The method of claim 18, wherein arranging the electrically insulating layer above the substrate comprises a lamination process.

* * * * *